(12) United States Patent
Cheng

(10) Patent No.: US 8,106,685 B2
(45) Date of Patent: Jan. 31, 2012

(54) SIGNAL RECEIVER AND VOLTAGE COMPENSATION METHOD

(75) Inventor: Wen-Chang Cheng, Taoyuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 12/538,175

(22) Filed: Aug. 10, 2009

(65) Prior Publication Data

US 2011/0032017 A1 Feb. 10, 2011

(51) Int. Cl.
*H03K 3/00* (2006.01)
(52) U.S. Cl. ........ 327/108; 327/112; 327/170; 327/359; 327/560; 326/21; 326/36; 326/30; 326/82
(58) Field of Classification Search .......... 327/108–112, 327/170, 359, 379–391, 560, 563; 326/21–27, 326/30, 82–83, 87
See application file for complete search history.

(56) References Cited

U.S. PATENT DOCUMENTS

| 6,812,735 B1* | 11/2004 | Pham | 326/30 |
| 7,236,016 B2* | 6/2007 | Forbes | 327/66 |
| 2004/0164763 A1* | 8/2004 | Kim et al. | 326/30 |
| 2009/0039913 A1* | 2/2009 | Matsudera | 326/30 |

* cited by examiner

*Primary Examiner* — Lincoln Donovan
*Assistant Examiner* — Shikha Goyal
(74) *Attorney, Agent, or Firm* — Winston Hsu; Scott Margo

(57) ABSTRACT

A signal receiver includes a first input terminal, a second input terminal, a first transistor, a second transistor and a variable load. The first and the second transistors each include a gate electrode, a first electrode and a second electrode. The gate electrode of the first transistor is coupled to the first input signal terminal, the gate electrode of the second transistor is coupled to the second input signal terminal, and the variable load is coupled to the first electrode of the first transistor, where a resistance of the first variable load is adjusted to make a DC level at an output node of the signal receiver keep a constant value.

10 Claims, 4 Drawing Sheets

US 8,106,685 B2

SIGNAL RECEIVER AND VOLTAGE COMPENSATION METHOD

BACKGROUND OF THE INVENTION

1. Field of the Invention

The present invention relates to a signal receiver, and more particularly, to a signal receiver which can compensate a voltage offset of an input signal to make the DC level at an output node of the signal receiver can keep a constant value, and a related voltage compensation method.

2. Description of the Prior Art

A semiconductor memory can be divided into two categories: a volatile memory, e.g. a dynamic random access memory (DRAM); and a non-volatile memory. The difference between these categories is whether the stored data can be reserved for a long time when external electric power is turned off. The data stored in the DRAM will disappear when the external electric power is turned off but the data stored in the non-volatile memory will be preserved.

Please refer to FIG. 1. FIG. 1 is a diagram showing a problem resulting from voltage offsets of a reference voltage in a signal receiver of a memory module according to the prior art. As shown in FIG. 1, $V_{REF}$ represents a reference voltage in a signal receiver of the memory module, offset reference voltages $V_{REF}'$ and $V_{REF}''$ respectively represent the reference voltage $V_{REF}$ having offsets, $V_{IN}$ represents an input signal of the signal receiver, and $V_{OUT}$ represents an output signal after the input signal $V_{IN}$ passes through the signal receiver. If no offset exists in the reference voltage $V_{REF}$, the output signal $V_{OUT}$ is generated after the input signal $V_{IN}$ passes through the signal receiver. If an offset exists in the reference voltage $V_{REF}$, such as the offset reference voltage $V_{REF}'$ or $V_{REF}''$, the output signal $V_{OUT}'$ or $V_{OUT}''$ is generated after the input signal $V_{IN}$ passes through the signal receiver. As can be seen from FIG. 1, if an offset exists in the reference voltage $V_{REF}$, the duty cycle of the output signal $V_{OUT}'/V_{OUT}''$ is different from that of the output signal $V_{OUT}$, which affects the accuracy of accessing data of the memory module.

Hence, how to overcome problems resulting from voltage offsets of the reference voltage in the signal receiver of the memory module has become an important topic of the field.

SUMMARY OF THE INVENTION

It is therefore an objective of the present invention to provide a signal receiver and related voltage compensation method to solve the above-mentioned problems.

According to one embodiment of the present invention, a signal receiver comprises a first input terminal, a second input terminal, a first transistor, a second transistor and a variable load. The first and the second transistors each include a gate electrode, a first electrode and a second electrode. The gate electrode of the first transistor is coupled to the first input signal terminal, the gate electrode of the second transistor is coupled to the second input signal terminal, and the variable load is coupled to the first electrode of the first transistor, where a resistance of the first variable load is adjusted to make a DC level at an output node of the signal receiver keep a constant value.

According to another embodiment of the present invention, a voltage compensation method comprises: providing a first transistor, wherein the first transistor includes a gate electrode, a first electrode and a second electrode, and the gate electrode of the first transistor is coupled to a first input signal terminal; providing a second transistor, wherein the second transistor includes a gate electrode, a first electrode and a second electrode, and the gate electrode of the second transistor is coupled to a second input signal terminal; providing a variable load, wherein the variable load is coupled to the first electrode of the first transistor; adjusting a resistance of the first variable load to make a DC level at an output node of the signal receiver keep a constant value.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
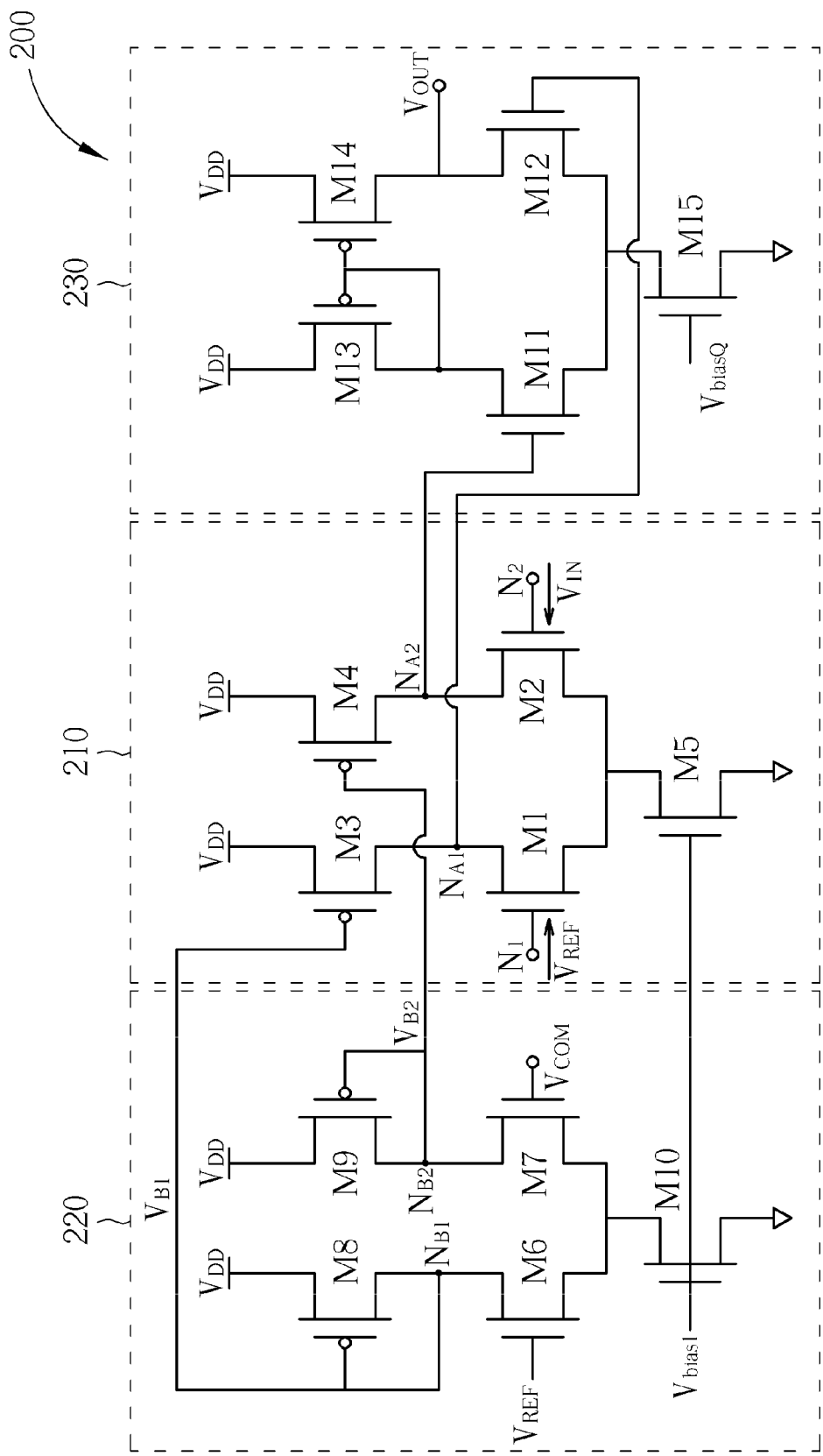
FIG. 2 is a diagram illustrating a signal receiver according to one embodiment of the present invention.

Please refer to FIG. 2. FIG. 2 is a diagram illustrating a signal receiver 200 according to one embodiment of the present invention. As shown in FIG. 2, the signal receiver 200 includes a first stage 210, a control signal generator 220 and a second stage 230. The first stage 210 includes two input signal terminals $N_1$ and $N_2$ and five metal-oxide semiconductor (MOS) transistors M1-M5, where the transistors M1 and M3 are coupled in cascode (i.e., a drain electrode of the transistor M1 is coupled to a drain electrode of the transistor M3 at a node $N_{A1}$), and the transistors M2 and M4 are coupled in cascode (i.e., a drain electrode of the transistor M2 is coupled to a drain electrode of the transistor M4 at a node $N_{A2}$). The control signal generator 220 includes five MOS transistors M6-M10, where the transistors M6 and M8 are coupled in cascode (i.e., a drain electrode of the transistor M6 is coupled to a drain electrode of the transistor M8 at a node $N_{B1}$), and the transistors M7 and M9 are coupled in cascode (i.e., a drain electrode of the transistor M7 is coupled to a drain electrode of the transistor M9 at a node $N_{B1}$). The second stage 230 includes five MOS transistors M11-M15. In addition, the transistors M5, M10 and M10 serve as current sources and are biased by bias voltages $V_{bias1}$ and $V_{bias2}$, respectively.

Figure 1:
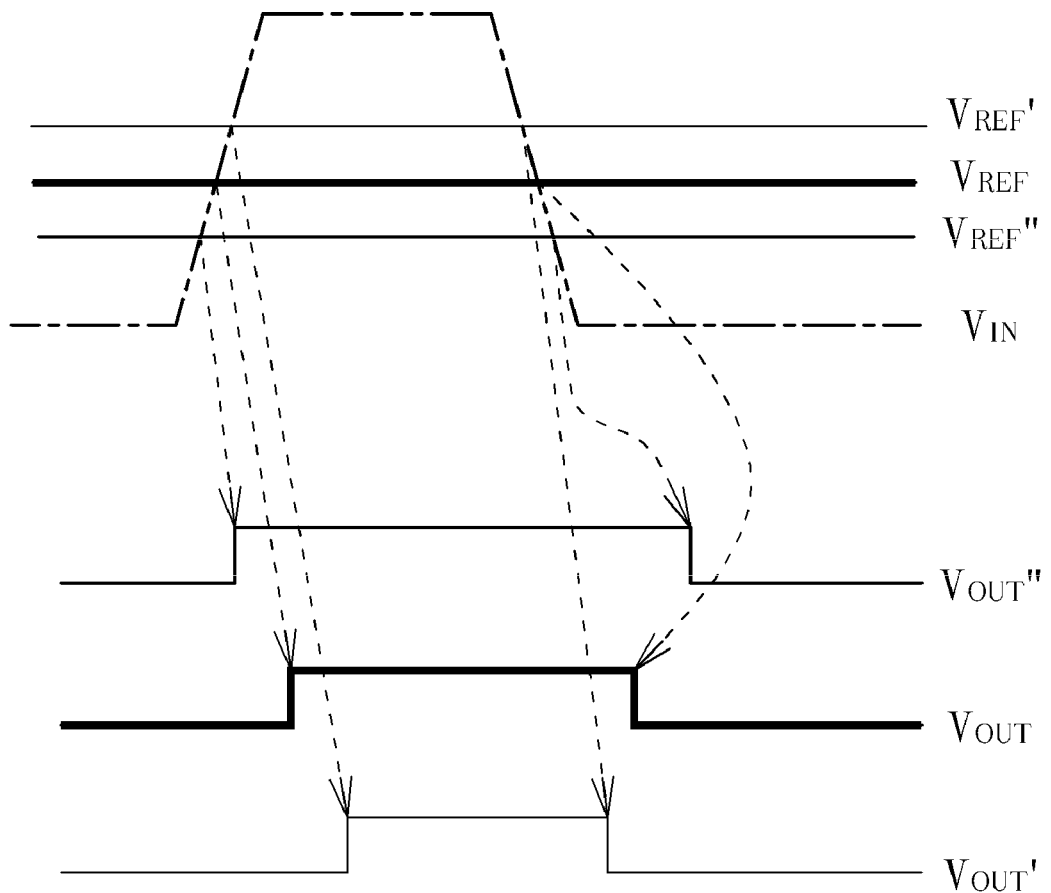
FIG. 1 is a diagram showing a problem resulting from voltage offsets of a reference voltage in a signal receiver of a memory module according to the prior art.

In the operations of the signal receiver 200, the first stage 210 receives a reference voltage $V_{REF}$ from the input signal terminal $N_1$ and receives an input signal $V_{IN}$ from the input signal terminal $N_2$, and generates two output signals at nodes $N_{A1}$ and $N_{A2}$. Then, the second stage 230 receives the two output signals from the first stage 210 and generates a single-end output signal $V_{OUT}$. Ideally, a voltage level of the reference voltage $V_{REF}$ is a predetermined value; however, because the reference voltage $V_{REF}$ is generally from an external element, a voltage offset exists in the reference voltage $V_{REF}$ as shown in FIG. 1. In the prior art signal receiver, the offset of the reference voltage $V_{REF}$ may cause the DC level at the nodes $N_{A1}$ and $N_{A2}$ to shift and the accuracy of the output signals of the first stage 210 will therefore be influenced. In the present invention, the transistors M3 and M4 serve as two variable loads, the resistances of the transistors M3 and M4 are respectively adjusted by two control signals $V_{B1}$ and $V_{B2}$ generated from the control signal generator 220, and the control signals $V_{B1}$ and $V_{B2}$ are generated according to the voltage level of the reference voltage $V_{REF}$. That is, the resistances of the transistors M3 and M4 are adjusted to compensate the variation (offset) of the reference voltage $V_{REF}$. Therefore, the DC levels at the nodes $N_{A1}$ and $N_{A2}$ will not be shifted (or slightly shifted) if an offset exists in the reference voltage $V_{REF}$, and the output signals of the first stage 210 are more accurate.

In the detailed operations of the control signal generator 220 of the signal receiver 200, the control signal generator 220 receives the reference voltage $V_{REF}$ and an internal reference voltage $V_{COM}$ and generates two control signals $V_{B1}$ and $V_{B2}$ at nodes $N_{B1}$ and $N_{B2}$, respectively, where a voltage level of the internal reference voltage $V_{COM}$ is substantially equal to the ideal voltage level of the reference voltage $V_{REF}$. Therefore, when the reference voltage $V_{REF}$ is greater than the internal reference $V_{COM}$, the voltage level of the control signal $V_{B1}$ is less than that of the control signal $V_{B2}$, the resistance of the transistor M3 is therefore less than the resistance of the transistor M4, and the DC level of the nodes $N_{A1}$ and $N_{A2}$ will not be shifted when a positive offset of the reference voltage $V_{REF}$ exists. When the reference voltage $V_{REF}$ is less than the internal reference voltage $V_{COM}$, the voltage level of the control signal $V_{B1}$ is greater than that of the control signal $V_{B2}$, the resistance of the transistor M3 is therefore greater than the resistance of the transistor M4, and the DC level of the nodes $N_{A1}$ and $N_{A2}$ will not be shifted when the negative offset of the reference voltage $V_{REF}$ exists. In other words, when the voltage level of the reference voltage $V_{REF}$ is increased, the resistance of the transistor M3 is decreased and the resistance of the transistor M4 is increased; and when the voltage level of the reference voltage $V_{REF}$ is decreased, the resistance of the transistor M3 is increased and the resistance of the transistor M4 is decreased. Thus, the DC levels at the nodes $N_{A1}$ and $N_{A2}$ will keep a constant value, and the output signals of the first stage 210 are more accurate.

It is noted that, in the signal receiver 200, M1, M2, M6, M7, M11 and M12 are NMOS transistors and M3, M4, M8, M9, M13 and M14 are PMOS transistors. In another embodiment, however, M1, M2, M6, M7, M11 and M12 can be implemented by PMOS transistors and M3, M4, M8, M9, M13 and M14 can be implemented by NMOS transistors. In the embodiment where M1 and M2 are implemented by PMOS transistors, when the voltage level of the reference voltage $V_{REF}$ is increased, the resistance of the transistor M3 is increased and the resistance of the transistor M4 is decreased; and when the voltage level of the reference voltage $V_{REF}$ is decreased, the resistance of the transistor M3 is decreased and the resistance of the transistor M4 is increased.

It is also noted that, in the signal receiver 200, all the transistors M1-M15 are MOS transistors. In another embodiment of the present invention, however, the signal receiver 200 can be implemented by bi-polar junction transistors (BJTs) (i.e., the MOS transistors M1-M15 are replaced by BJTs). A person skilled in this art should understand how to utilize the BJTs to implement the signal receiver in such a design after reading the above description regarding the signal receiver 200, and therefore further descriptions are omitted here.

Please also note that the aforementioned signal receiver 200 can be disposed inside a memory module, and the input signal $V_{IN}$ can be a data signal (DQ signal) of the memory module.

Figure 3:
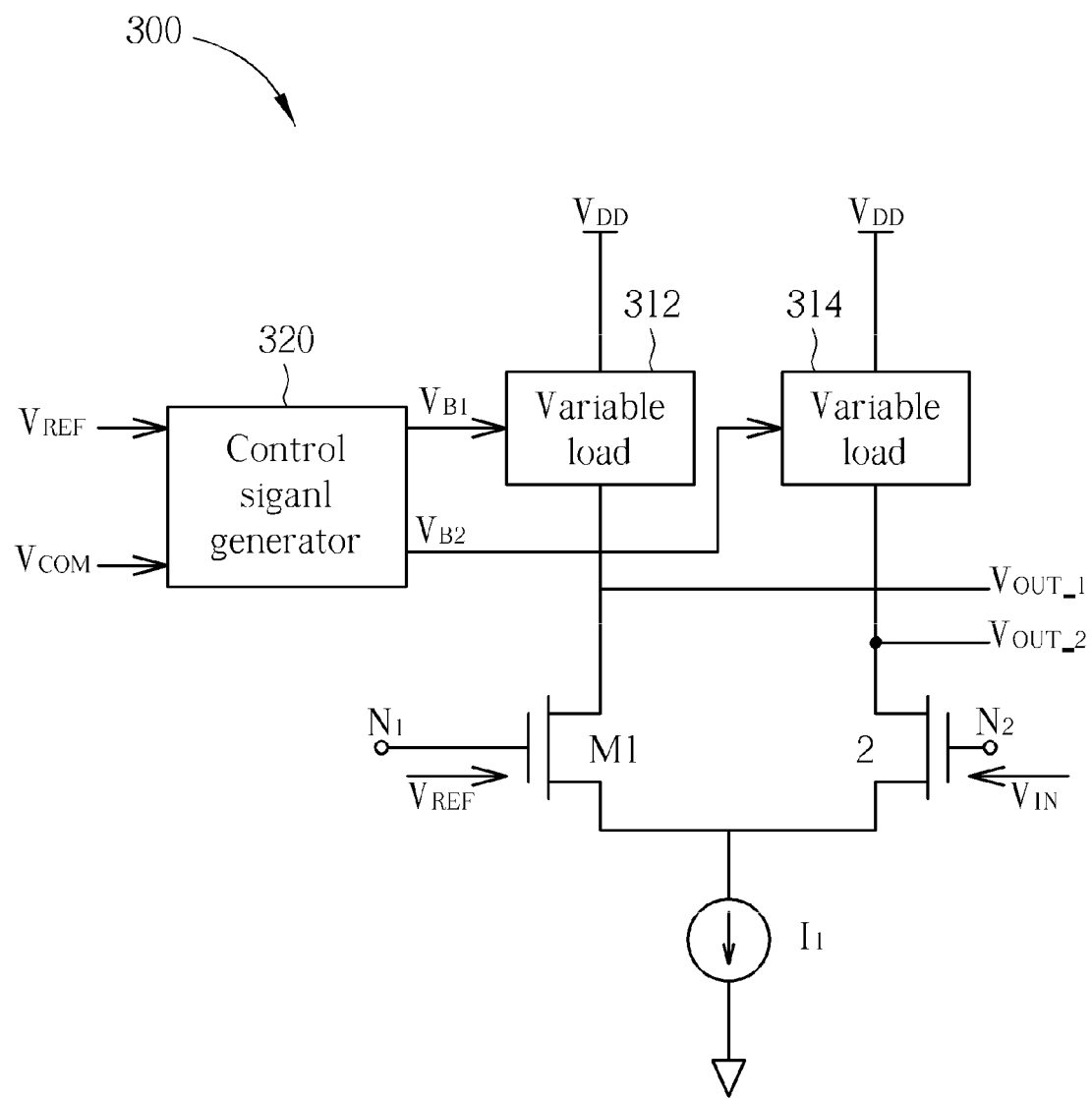
FIG. 3 is a generalized architecture of an exemplary signal receiver of the present invention.

The signal receiver 200 shown in FIG. 2 is merely an embodiment of the present invention. As long as the DC levels at the nodes $N_{A1}$ and $N_{A2}$ can keep constant respective values, the signal receiver can be implemented in another available circuit design. FIG. 3 is a generalized architecture of an exemplary signal receiver 300 of the present invention. As shown in FIG. 3, the signal receiver 300 includes two input signal terminals $N_1$ and $N_2$, two MOS transistors M1 and M2, two variable loads 312 and 314 and a control signal generator 320. The operations of the signal receiver 300 are largely similar to the first stage 210 and the control signal generator 220 shown in FIG. 2. A person skilled in this art should understand the operations of the signal receiver 300 after reading the above descriptions regarding the signal receiver 200 shown in FIG. 2. Further descriptions are therefore omitted here.

Figure 4:
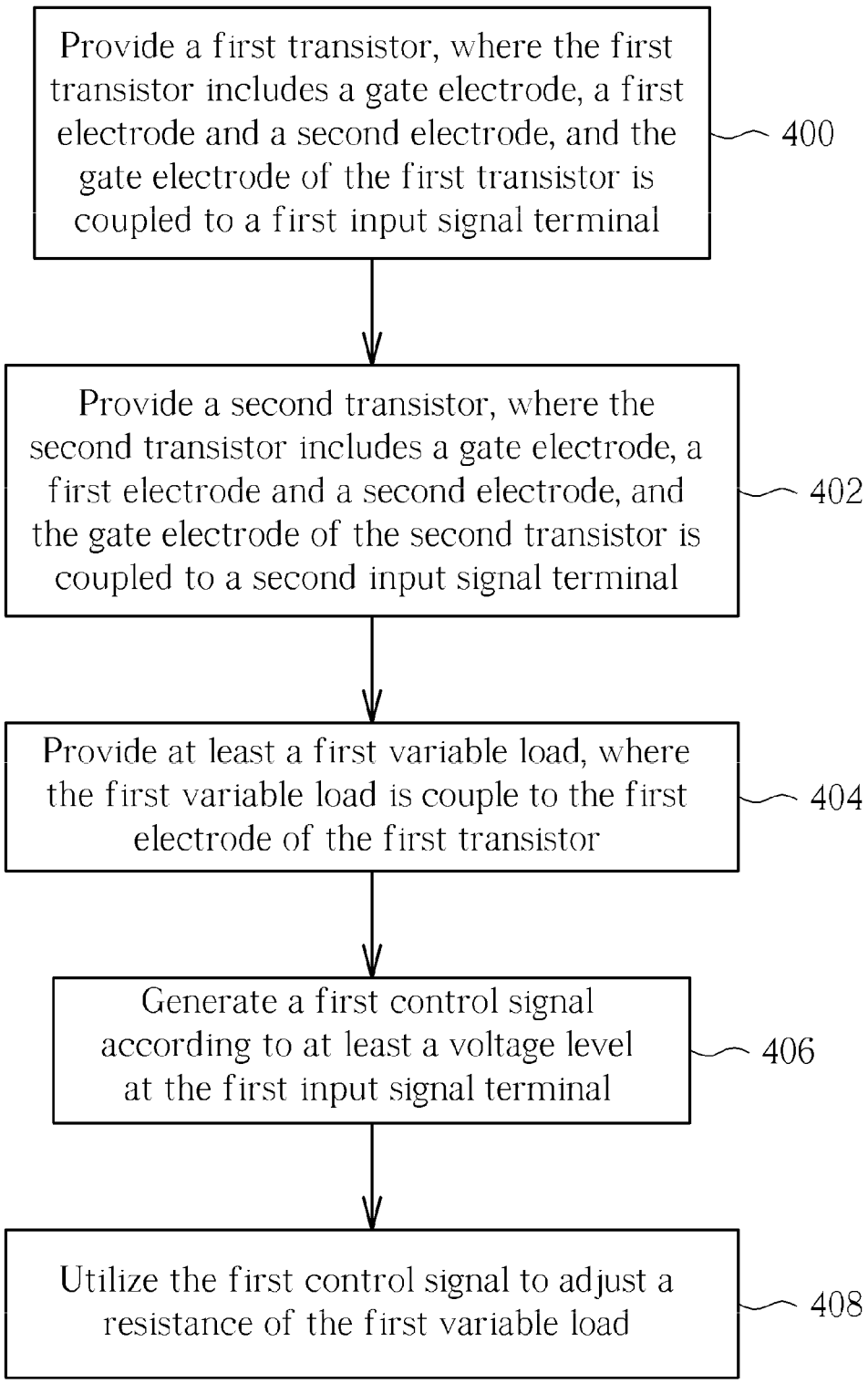
FIG. 4 is a flowchart of compensating a voltage offset according to one embodiment of the present invention.

Please refer to FIG. 4. FIG. 4 is a flowchart of compensating a voltage offset according to one embodiment of the present invention. Referring to the signal receiver 300 shown in FIG. 3 and the flowchart shown in FIG. 4, the method of compensating the voltage offset of the reference voltage $V_{REF}$ in the signal receiver 300 is as follows:

Step 400: provide a first transistor, where the first transistor includes a gate electrode, a first electrode and a second electrode, and the gate electrode of the first transistor is coupled to a first input signal terminal;

Step 402: provide a second transistor, where the second transistor includes a gate electrode, a first electrode and a second electrode, and the gate electrode of the second transistor is coupled to a second input signal terminal;

Step 404: provide at least a first variable load, where the first variable load is coupled to the first electrode of the first transistor;

Step 406: generate a first control signal according to at least a voltage level at the first input signal terminal; and Step 408: utilize the first control signal to adjust a resistance of the first variable load.

Briefly summarized, the signal receiver of the present invention includes a control signal generator which generates two control signals to adjust the resistances of the variable loads. Therefore, DC level of the output signal of the signal receiver will not be shifted, and the accuracy of the output signal of the signal receiver is thereby improved.

Those skilled in the art will readily observe that numerous modifications and alterations of the device and method may be made while retaining the teachings of the invention.

What is claimed is:

1. A signal receiver, comprising: a first input signal terminal, for receiving a reference voltage; a second input signal terminal; a first transistor, including a gate electrode coupled to the first input signal terminal and a first electrode and a second electrode; a second transistor, including a gate electrode coupled to the second input signal terminal and a first electrode and a second electrode; a first variable load, coupled in cascode to the first electrode of the first transistor and having an adjustable resistance to keep a DC level at an output node of the signal receiver a constant value; and a control signal generator, for generating a first control signal by directly comparing a voltage level of the reference voltage with a predetermined voltage level, and utilizing the first control signal to adjust the resistance of the first variable load; wherein the first transistor is an N-type metal-oxide semiconductor (NMOS) transistor, and the control signal generator utilizes the first control signal to increase the resistance of the first variable load when the voltage level of the reference voltage is decreased, and to decrease the resistance of the first variable load when the voltage level of the reference voltage is increased.

2. The signal receiver of claim 1, further comprising:
a second variable load, coupled to the first electrode of the second transistor;

wherein the control signal generator further generates a second control signal according to at least the voltage level of the reference voltage, and utilizes the second control signal to adjust a resistance of the second variable load.

3. The signal receiver of claim 2, wherein the control signal generator utilizes the second control signal to decrease the resistance of the second variable load when the voltage level of the reference voltage is decreased, and to increase the resistance of the second variable load when the voltage level of the reference voltage is increased.

4. The signal receiver of claim 2, wherein the control signal generator generates the second control signal by comparing the voltage level of the reference voltage with the predetermined voltage level.

5. A voltage compensation method, comprising: providing a first transistor, wherein the first transistor includes a gate electrode, a first electrode and a second electrode, and the gate electrode of the first transistor is coupled to a first input signal terminal for receiving a reference voltage, and the first transistor is an N-type metal-oxide semiconductor (NMOS) transistor; providing a second transistor, wherein the second transistor includes a gate electrode, a first electrode and a second electrode, and the gate electrode of the second transistor is coupled to a second input signal terminal; providing a first variable load, wherein the first variable load is coupled in cascode to the first electrode of the first transistor; generating a first control signal by directly comparing a voltage level of the reference voltage with a predetermined voltage level; and utilizing the first control signal to increase the resistance of the first variable load when the voltage level of the reference voltage is decreased, and to decrease the resistance of the first variable load when the voltage level of the reference voltage is increased, to make a DC level at an output node of the signal receiver keep a constant value.

6. The voltage compensation method of claim 5, further comprising:
    providing a second variable load, wherein the second variable load is coupled to the first electrode of the second transistor;
    generating a second control signal according to at least the voltage level of the reference voltage; and
    utilizing the second control signal to adjust a resistance of the second variable load.

7. The voltage compensation method of claim 6, wherein the second transistors is an NMOS transistors, and the step of utilizing the second control signal to adjust the resistance of the second variable load comprises:
    utilizing the second control signal to decrease the resistance of the second variable load when the voltage level of the reference voltage is decreased, and to increase the resistance of the second variable load when the voltage level of the reference voltage is increased.

8. The voltage compensation method of claim 6, wherein the step of generating the second control signal according to at least the voltage level at the first input signal terminal comprises:
    generating the first and the second control signals by comparing the voltage level of the reference voltage with the predetermined voltage level.

9. A signal receiver, comprising: a first input signal terminal, for receiving a reference voltage; a second input signal terminal; a first transistor, including a gate electrode coupled to the first input signal terminal and a first electrode and a second electrode; a second transistor, including a gate electrode coupled to the second input signal terminal and a first electrode and a second electrode; a current source, coupled to the second electrode of the first transistor and the second electrode of the second transistor; a first variable load, coupled in cascode to the first electrode of the first transistor and having an adjustable resistance to keep a DC level at an output node of the signal receiver a constant value; and a control signal generator, for generating a first control signal by directly comparing a voltage level of the reference voltage with a predetermined voltage level, and utilizing the first control signal to adjust the resistance of the first variable load.

10. A voltage compensation method, comprising: providing a first transistor, wherein the first transistor includes a gate electrode, a first electrode and a second electrode, and the gate electrode of the first transistor is coupled to a first input signal terminal for receiving a reference voltage; providing a second transistor, wherein the second transistor includes a gate electrode, a first electrode and a second electrode, and the gate electrode of the second transistor is coupled to a second input signal terminal; providing a current source, wherein the current source is coupled to the second electrode of the first transistor and the second electrode of the second transistor; providing a first variable load, wherein the first variable load is coupled in cascode to the first electrode of the first transistor; generating a first control signal by directly comparing a voltage level of the reference voltage with a predetermined voltage level; and utilizing the first control signal to adjust a resistance of the first variable load to make a DC level at an output node of the signal receiver keep a constant value.

* * * * *